(12) United States Patent
Kim

(10) Patent No.: US 6,982,857 B2
(45) Date of Patent: Jan. 3, 2006

(54) ELECTROMAGNETIC WAVE SHIELD DEVICE

(75) Inventor: Doo Sang Kim, Seoul (KR)

(73) Assignee: HappyMedical Co., Ltd., Seoul (KR)

( * ) Notice: Subject to any disclaimer, the term of this patent is extended or adjusted under 35 U.S.C. 154(b) by 315 days.

(21) Appl. No.: 10/352,003

(22) Filed: Jan. 28, 2003

(65) Prior Publication Data

US 2003/0141950 A1 Jul. 31, 2003

(30) Foreign Application Priority Data

Jan. 29, 2002 (KR) ...................... 10-2002-0005071

(51) Int. Cl.
*H02H 3/00* (2006.01)
(52) U.S. Cl. ........................... 361/42; 361/44; 361/115
(58) Field of Classification Search .................. 361/42, 361/44, 45, 115
See application file for complete search history.

(56) References Cited

U.S. PATENT DOCUMENTS

| | | | |
|---|---|---|---|
| 5,837,971 A | 11/1998 | Lee | 219/212 |
| 6,300,597 B1 | 10/2001 | Lee | 219/212 |
| 6,392,554 B1 * | 5/2002 | Lee et al. | 340/657 |

* cited by examiner

*Primary Examiner*—Stephen W. Jackson
(74) *Attorney, Agent, or Firm*—Staas & Halsey LLP

(57) ABSTRACT

Disclosed is a device for shielding an electromagnetic wave. The electromagnetic wave shield device comprises a relay having a contact selectively connected to a first terminal or a second terminal of a power receptacle; a controller controlling the connection between the contact of the relay and the first terminal or the connection between the contact of the relay and the second terminal, comparing the first voltage value generated by the connection between the contact of the relay and the first terminal with the second voltage generated by the connection between the contact of the relay and the second terminal, and controlling the relay so that the contact of the relay is connected to the terminal having the lower voltage value; and an electromagnetic wave shielding unit for providing the electromagnetic wave generated by an electric and electronic device to the terminal having the lower voltage value.

7 Claims, 2 Drawing Sheets

ELECTROMAGNETIC WAVE SHIELD DEVICE

TECHNICAL FIELD

The present invention relates to an electromagnetic wave shield device, and particular to an electromagnetic wave shield device capable of reducing the electromagnetic wave harmful to the human body by guiding the electromagnetic wave generated from various electric and electronic devices or appliances to the ground terminal of the AC receptacle.

BACKGROUND OF THE INVENTION

In general, an electromagnetic wave is a type of energy generated by using electricity, and means composite wave of electrical field and magnetic field.

Also, the electromagnetic wave is not material but energy in view of physical science, because it has not mass or temperature, and is not visible. However, it is harmful to the human body. When a human body is exposed to the electromagnetic wave, the human body is affected by the electromagnetic wave. For example, when the distribution of Na ion and K ion through cell membrane is changed by the electromagnetic wave, secretion quantity of the hormone (melatonin) in the human body is reduced, and the body temperature is raised. Also, according to the research of WTO, the electromagnetic wave having very low frequency of 0~1000 Hz and low frequency of 1~5000 KHz is generated when AC power generating the frequency of 60 Hz is used in home. Therefore if the human body is exposed to the electromagnetic wave for a long time, the human body becomes weak due to the change of body temperature and biorhythm.

Accordingly, the human body must be protected from the electromagnetic wave generated by electronic and electrical devices, appliances, instruments and machines in order that a person does not take a disease. In particular it is very important to shield the electromagnetic wave in electric devices such as an electric warmth device including electric blanket or floor paper, a health auxiliary device including a warmth lumbar band, and a warmth vest or a warmth cushion which are used in directly contact with the human body, and electronic device such as a computer and so on.

It is described below for the problems of the traditional warmth device.

In general, the warmth device includes a warmth wire therein and shielding material surrounding the warmth wire to shield the electromagnetic wave generated from the warmth wire. The shielding material guides the electromagnetic wave to the ground. If the electromagnetic wave is not guided to the ground, the human body is directly affected by the electromagnetic wave.

Japanese Utility Model Publication No. 3016977 has disclosed an electromagnetic wave shield device that shields the leakage of the electromagnetic wave from the electric and electronic devices by detecting the ground terminal from the terminals of AC power and connecting the devices to the ground terminal.

However the conventional electromagnetic wave shield device further needs a ground detecting apparatus for detecting the ground terminal to guide the electromagnetic wave to the ground terminal. However, because the ground detecting apparatus has a complicated construction, it has a problem raising cost in manufacturing.

DISCLOSURE OF THE INVENTION

Therefore, the present invention has been made in view of the above-mentioned problems, and it is an object of the present invention to provide a electromagnetic wave shield device capable of shielding the electromagnetic wave harmful to the human body by automatically detecting the grounded terminal of the AC power and guiding the electromagnetic wave generated from electric and electronic devices to the detected ground terminal.

It is another object of the present invention to provide an electromagnetic wave shield device capable of reducing number of components and cutting down the production cost of the circuit by incorporating the circuit for detecting the ground terminal into PCB circuit.

According to an aspect of the present invention, there is provided a electromagnetic wave shield device, the electromagnetic wave shield device comprising a relay having a contact selectively connected to a first terminal or a second terminal of a power receptacle; a controller controlling the connection between the contact of the relay and the first terminal or the connection between the contact of the relay and the second terminal, comparing the first voltage value generated by the connection between the contact of the relay and the first terminal with the second voltage generated by the connection between the contact of the relay and the second terminal, and controlling the relay so that the contact of the relay is connected to the terminal having the lower voltage value; and an electromagnetic wave shielding unit for providing the electromagnetic wave generated by an electric and electronic device to the terminal having the lower voltage value.

Preferably, the device further comprises a voltage adjusting unit for transforming the voltage supplied from the relay to the voltage level adapted for the controller.

Preferably, the relay comprises a transformer for generating a secondary voltage induced by the voltage applied to the contact of the relay.

Preferably, the device further comprises a power supplying unit for controlling the operation of the controller by the secondary voltage supplied from the transformer.

Preferably, the device further comprises a first and a second capacitors connected in parallel between the electromagnetic wave shielding unit and the contact of the relay.

Preferably, the power supplying unit comprises a power terminal; a ground terminal; a first diode connected between the power terminal and the ground terminal; a transistor connected between the first diode and the ground terminal; and a first resistor having one end connected to the base of the transistor and the other end connected to the controller, wherein the first diode is connected in parallel with the transformer of the relay.

Preferably, the transistor comprises a NPN type bipolar transistor.

Preferably, the voltage adjusting unit comprises a power terminal; a ground terminal; a second resistor connected between the contact of the relay and the controller; a third capacitor connected between the second resistor and the ground terminal; a second diode connected between the power terminal and the second resistor; a third resistor connected between the second diode and the ground terminal in parallel with the third capacitor; and a third diode connected between the second diode and the ground terminal in parallel with the third resistor.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Reference will now be made in detail to the preferred embodiments of the present invention.

Figure 1:
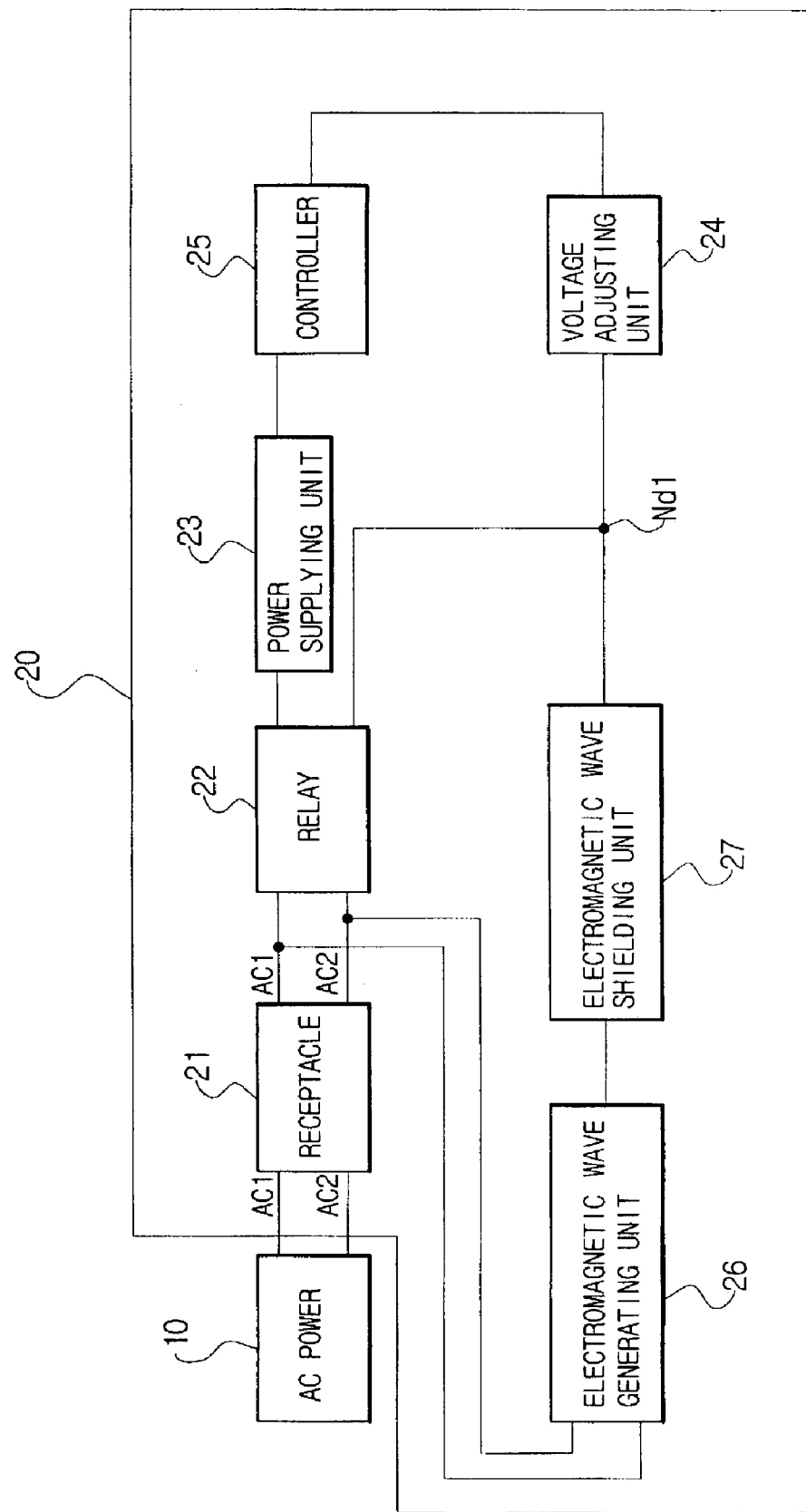
FIG. 1 is a block diagram of an electromagnetic wave shield device according to the present invention.

FIG. 1 is a block diagram of an electromagnetic wave shield device according to the present invention.

As shown in FIG. 1, the electromagnetic wave shield device 20 comprises an AC power receptacle 21, a relay 22, a power supplying unit 23, a voltage adjusting unit 24, a controller 25, an electromagnetic wave generating unit 26, and an electromagnetic wave shielding unit 27.

The AC power receptacle 21 has two terminals AC1 and AC2, wherein the one of terminals AC1 and AC2 is to supply AC power, and the other is connected to the ground. The terminals of the receptacle 21 are electrically connected to the terminals of AC power 10 to provide power to the electromagnetic wave shield device 20.

The relay 22 outputs the first voltage from the receptacle 21 to the voltage adjusting unit 24 via node Nd1, and also supplies the second voltage induced by the first voltage to the power supplying unit 23. The relay 22 is controlled with the controller 25.

The power supplying unit 23 supplies the second voltage from the relay 22 to the controller 25.

The voltage adjusting unit 24 drops the voltage level of the first voltage to the voltage level adapted for the controller 25.

The controller 25 compares the voltage supplied from the first terminal AC1 of the receptacle 21 with the voltage supplied from the second terminal AC2 via the voltage adjusting unit 24 thereby operating the relay 22 to connect the terminal having the lower voltage value to node Nd1.

The electromagnetic wave generating unit 26 generates an electromagnetic wave by the voltages supplied from the receptacle 21.

The electromagnetic wave shielding unit 27 guides the electromagnetic wave supplied from the electromagnetic wave generating unit 26 to the ground terminal of the AC power receptacle 21 via the relay 22.

Accordingly, the electromagnetic wave supplied from the electromagnetic wave generating unit 26 is guided to the ground terminal of the receptacle 21 via the electromagnetic wave shielding unit 27 and the relay 22. As a result, the electromagnetic wave can not be reached to the human body.

Figure 2:
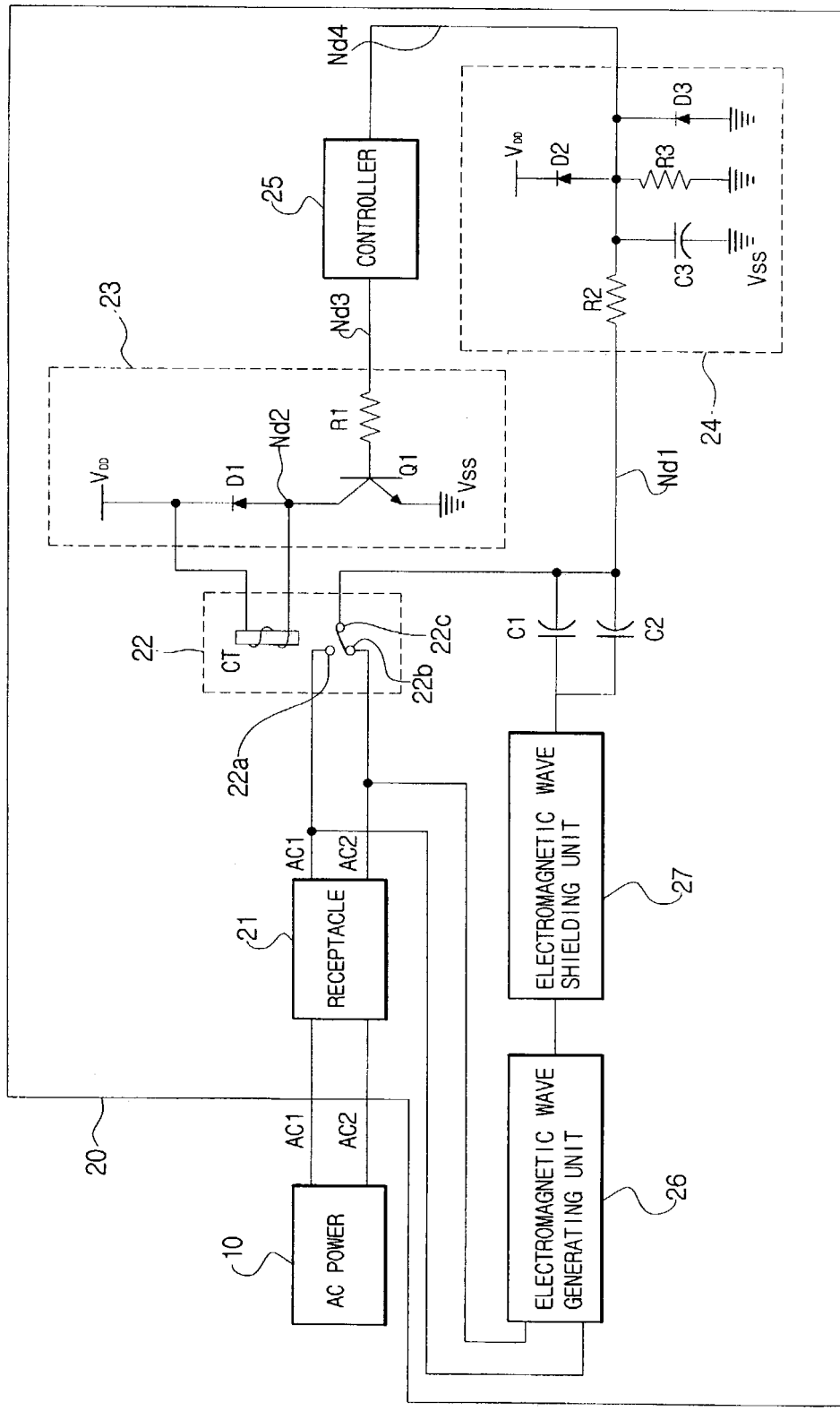
FIG. 2 is a circuit of the electromagnetic wave shield device according to the present invention.

FIG. 2 is a circuit of the electromagnetic wave shield device according to the present invention.

As shown in FIG. 2, the relay 22 includes the first contact 22a corresponding to the terminal AC1 of the AC power receptacle 21, the second contact 22b corresponding to the terminal AC2 of the AC power receptacle 21, the third contact 22c connected to the first node Nd1, and a transformer CT connected between the power terminal $V_{DD}$ of the power supplying unit 23 and the second node Nd2 for outputting the secondary voltage induced by the voltage at the first contact 22a to the second node Nd2.

The power supplying unit 23 includes a diode D1 for prohibiting the current from flowing the power terminal $V_{DD}$ to the node Nd2, a transistor Q1 having a collector connected to the second node Nd2, and a source connected to the ground terminal Vss, and a first resistor R1 connected between the base of the transistor Q1 and the third node Nd3. The transistor Q1 may be a NPN type bipolar transistor. The voltage at the third node Nd3 is the voltage value outputted from the controller 25.

On the other hand, a first capacitor C1 and a second capacitor C2 are connected in parallel between the first node Nd1 and the electromagnetic wave shield unit 27. Capacitors C1 and C2 function as a stabilizer for stabling the voltage level at the node Nd1.

The voltage adjusting unit 24 comprises a second resistor R2 connected between the first node Nd1 and the fourth node Nd4, a third capacitor C3 connected between the node Nd4 an ground terminal Vss, a third resistor R3 connected between the node Nd4 and the ground terminal Vss, and a third diode D3 connected between the fourth node Nd4 and the ground terminal Vss. The voltage at the node Nd4 is inputted as an input signal of the controller 35.

The voltage at the ground terminal of the AC power receptacle 21 is lower than the voltage at the power terminal thereof because the ground terminal is grounded. The voltage at the power terminal of the receptacle 21 is measured about 3.0V, and the voltage at the ground terminal thereof is measured about 2.6V as a result of measurement by the voltage adjusting unit 24.

As shown in FIG. 2, when the contact 22c of the relay 22 is connected to the contact 22a, the voltage at the terminal AC1 of the receptacle 21 is applied to the node Nd1 through the node 22c. The voltage at the node Nd1 is dropped to the predetermined level adapted for the controller 25 by the second resistor R2 and the third capacitor C3, the dropped voltage is distributed by the second diode D2 and the third resistor R3. And then the distributed voltage is inputted into the controller 25 via the fourth node Nd4. At this time, the voltage at the fourth node Nd4 is about 3V if the terminal AC1 of the AC receptacle 21 is the power terminal. Also, the second and the third diodes D2 and D3 input a sinusoidal wave to the controller 25.

Next, when the contact 22c of the relay 22 is connected to the contact 22b, the voltage at the terminal AC2 of the receptacle 21 is applied to the node Nd1 through the node 22c. The voltage at the node Nd1 is dropped to the predetermined level adapted for the controller 25 by the second resistor R2 and the third capacitor C3, the dropped voltage is distributed by the second diode D2 and the third resistor R3. And then the distributed voltage is inputted into the controller 25 via the fourth node Nd4.

The controller 25 compares the voltage inputted when the contact 22c of the relay 22 is connected to the contact 22a with the voltage inputted when the contact 22c of the relay 22 is connected to the contact 22b, and controls the operation of the relay 22 so that the contact 22c may be connected to the contact having the lower voltage. For example, when the voltage at the contact 22b is lower than the voltage at the contact 22a, the contact 22b of the relay 22 is connected to the contact 22c as shown in FIG. 2.

Accordingly, it is very difficult for the electromagnetic wave to reach to the human body because the electromagnetic wave generated by the electromagnetic wave generating unit 27 is transmitted to the terminal AC2 of the AC power receptacle 21 connected to the ground via the electromagnetic shielding unit 27, two capacitors C1 and C2, and contacts 22c and 22b of the relay 22.

In above-mentioned description, the electromagnetic wave generating unit 26 corresponds to a hot wire in case of the electric warmth device, and the electromagnetic wave shielding unit 27 corresponds to a shielding material. The shielding material comprises a metal plate for capable of absorbing or shielding the electromagnetic wave. The shielding material also may comprise a conductive fabric manufactured by forming a powder or a superfine metal filament from gold, silver, copper, nickel and so on, and weaving them with fibers, or by coating them with fibers.

According to the present invention, it is possible to automatically shield the electromagnetic wave generated by various electric and electronic devices, appliances and so on contactable to the human body.

As above-mentioned, the electromagnetic wave shield device according to the present invention is capable of shielding the electromagnetic wave harmful to the human body by automatically detecting the ground terminal of the terminals of the receptacle, and guiding the electromagnetic wave to the ground terminal.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

What is claimed is:

1. An apparatus for shielding an electromagnetic wave comprising:
    a relay having a contact selectively connected to a first terminal or a second terminal of a power receptacle;
    a controller controlling the connection between the contact of the relay and the first terminal or the connection between the contact of the relay and the second terminal, comparing the first voltage value generated by the connection between the contact of the relay and the first terminal with the second voltage generated by the connection between the contact of the relay and the second terminal, and controlling the relay so that the contact of the relay is connected to the terminal having the lower voltage value;
    an electromagnetic wave shielding unit for providing the electromagnetic wave generated by an electric and electronic device to the terminal having the lower voltage value; and
    a voltage adjusting unit for transforming the voltage supplied from the relay to the voltage level adapted for the controller.

2. The apparatus as claimed in claim 1, wherein the relay comprises a transformer for generating a secondary voltage induced by the voltage applied to the contact of the relay.

3. The apparatus as claimed in claim 2, wherein the apparatus further comprises a power supplying unit for controlling the operation of the controller by the secondary voltage supplied from the transformer.

4. The apparatus as claimed in claim 1, wherein the apparatus further comprises a first and a second capacitors connected in parallel between the electromagnetic wave shielding unit and the contact of the relay.

5. The apparatus as claimed in claim 2, wherein the power supplying unit comprises:
    a power terminal;
    a ground terminal;
    a first diode connected between the power terminal and the ground terminal;
    a transistor having a collector connected the diode, an emitter connected to the ground terminal and a base; and
    a first resistor having one end connected to the base of the transistor and the other end connected to the controller, wherein the first diode is connected in parallel with the transformer of the relay.

6. The apparatus as claimed in claim 5, wherein the transistor comprises a NPN type bipolar transistor.

7. The apparatus as claimed in claim 1, wherein the voltage adjusting unit comprises:
    a power terminal;
    a ground terminal;
    a second resistor connected between the contact of the relay and the controller;
    a third capacitor connected between the second resistor and the ground terminal;
    a second diode connected between the power terminal and the second resistor;
    a third resistor connected between the second diode and the ground terminal in parallel with the third capacitor; and
    a third diode connected between the second diode and the ground terminal in parallel with the third resistor.

* * * * *